US006958721B2

(12) United States Patent
Vincent et al.

(10) Patent No.: US 6,958,721 B2
(45) Date of Patent: Oct. 25, 2005

(54) MATCHED DELAY LINE VOLTAGE CONVERTER

(75) Inventors: Michael Vincent, Ellicott City, MD (US); Dragan Maksimovic, Boulder, CO (US)

(73) Assignee: The Regents of the University of Colorado, Boulder, CO (US)

( * ) Notice: Subject to any disclaimer, the term of this patent is extended or adjusted under 35 U.S.C. 154(b) by 132 days.

(21) Appl. No.: 10/666,064

(22) Filed: Sep. 18, 2003

(65) Prior Publication Data

US 2005/0062482 A1 Mar. 24, 2005

(51) Int. Cl.[7] ............................................. H03M 1/60
(52) U.S. Cl. ...................................... 341/157; 341/155
(58) Field of Search ................................ 341/118, 120, 341/155–170

(56) References Cited

U.S. PATENT DOCUMENTS

| | | | | |
|---|---|---|---|---|
| 4,758,821 A | * | 7/1988 | Nelson et al. | 341/157 |
| 5,396,247 A | * | 3/1995 | Watanabe et al. | 341/157 |
| 5,894,238 A | * | 4/1999 | Chien | 327/112 |
| 6,492,922 B1 | * | 12/2002 | New | 341/120 |
| 6,509,861 B2 | * | 1/2003 | Watanabe | 341/157 |
| 6,850,178 B2 | * | 2/2005 | Watanabe | 341/155 |

FOREIGN PATENT DOCUMENTS

WO    WO 03/050837    6/2003

OTHER PUBLICATIONS

Patella, "Implementation of a High Frequency, Low–Power Digital Pulse Width Modulation Controller Chip", thesis submitted to the University of Colorado, 2000, pp. 1–272, Boulder, Colorado no date/month.

Maksimovic et al., "Digital Controller For High–Frequency Switching Power Supplies", Invention disclosure, Nov. 15, 2001, pp. 1–15, CoPEC—Colorado Power Electronics Center, University of Colorado at Boulder, Colorado.

* cited by examiner

Primary Examiner—Michael Tokar
Assistant Examiner—Linh V. Nguyen
(74) Attorney, Agent, or Firm—Patton Boggs LLP

(57) ABSTRACT

A method and apparatus for measuring or converting voltage, the method comprising: applying an input voltage to a primary delay line; applying a reference voltage to a timer delay line; propagating a delay signal through the primary delay line; propagating a timer signal through the timer delay line; establishing a sampling period based on the timer signal propagation; and measuring an extent of delay signal propagation along the primary delay line during the established sampling period, the measured signal propagation extent being indicative of a difference between the input voltage and the reference voltage.

20 Claims, 14 Drawing Sheets

MATCHED DELAY LINE VOLTAGE CONVERTER

BACKGROUND OF THE INVENTION

1. Field of the Invention

The invention relates in general to voltage measurement such as in analog-to-digital converters and in particular to low-power, high-speed analog-to-digital converters.

2. Statement of the Problem

Analog-to-digital converters (ADCs) are used in electronic systems where signals produced by sensors (such as microphones, temperature probes, light sensors, and speed or position transducers) or activators (such as voltage sources and amplifiers) are analog voltages, and where processing is performed in the digital domain. Some characteristics of an ADC include the analog input voltage range; the resolution, which is typically the analog voltage corresponding to the least significant bit (LSB); the conversion time (the time it takes to update the digital output for a given analog input voltage); and the linearity of the ADC input-to-output characteristic.

In digitally controlled power supplies, the ADC is typically used to sample an output voltage (or some other voltage or current of interest) of a device and compare it to a reference voltage to produce a digital error signal indicative of the difference between the compared voltages. In direct-current (DC) power supplies, the voltage reference is typically a constant voltage independent of temperature.

Nyquist-rate ADCs form one existing category of ADCs. These ADCs typically sample at twice the frequency of the highest frequency component of the input being sampled. The characteristics of a selection of Nyquist-rate ADCs are discussed below.

A successive approximation ADC receives an analog voltage as a first input into a differential comparator. The comparator output, in turn, provides a control signal to a counter which then outputs a digital value corresponding to a "first round" approximation of the magnitude of the received analog voltage. This digital value is then fed into a digital-to-analog converter (DAC), which completes a feedback path by supplying a second input to the differential comparator. The comparator compares the analog input voltage to the analog quantity output from the DAC. The comparator output then causes the counter to raise or lower the DAC output to more closely match the analog input voltage. A significant drawback of the successive approximation ADC is that it is slow to reach a steady-state output value.

Where speed is of paramount concern, a flash converter, also known as a parallel converter, may be employed. The flash ADC is distinctive in having a conversion time of less than a single clock cycle. The converter includes a plurality of differential comparators with each comparator being dedicated to a particular voltage level. Each comparator is supplied with a common input voltage and a distinct reference voltage using a voltage-divider network. Although it offers the advantage of rapid conversion time, the flash ADC is limited by its high power consumption, susceptibility to noise, and the need for large die areas.

The "windowed" flash ADC offers higher resolution than the standard flash ADC by concentrating a disproportionate number of comparators within a voltage range of interest. While this approach offers greater resolution than the standard flash ADC, a large number of analog comparators is required, thereby exacerbating the problems of power consumption and large die area requirements of the standard flash ADCs.

The conversion accuracy of flash ADCs is a strong function of the accuracy of the values of resistors used in voltage dividers and of the characteristics of the analog comparators used to provide each output bit. Accordingly, careful design and/or selection of these devices is needed to ensure accurate conversion accuracy. One variation of the flash ADC uses digital error correction to compensate for variation inherent in the resistors and comparators. Although this approach improves the accuracy of flash converters, the drawbacks of a high power requirement and large required die area remain.

Over-sampling ADCs offer a less noisy solution than Nyquist-rate converters. With Nyquist-rate converters, quantization noise arising from conversion of an analog input signal is typically concentrated within a limited frequency range. The higher sampling frequency of over-sampling ADCs spreads the noise power over a much larger spectrum. Consequently, the proportion of quantization noise within the frequency band of the analog input signal is lower in over-sampling ADCs than in Nyquist-rate ADCs. Transmitting the noisy signal through a low-pass filter (LPF), therefore, can substantially reduce noise in the digital output. However, over-sampling ADCs require very high power consumption to support the high sampling frequencies employed.

Thus, there is a need for an ADC that operates at high speed while utilizing low power and, at the same time, has low die area and does not depend on the precision of individual analog components.

SUMMARY OF THE INVENTION

The present invention advances the art and helps to overcome the aforementioned problems by providing an ADC which occupies very little space, consumes little power, and which compensates for temperature and process variations among its components. Moreover, the inventive ADC may be implemented using only digital logic gates, thereby avoiding the need for, and the performance variations of, precision analog components. In the preferred embodiment, the digital logic gates included in the inventive ADC can be effectively modeled using electronic design automation (EDA), such as hardware description languages (HDLs), thereby simplifying and shortening design time.

In the preferred embodiment, an analog-to-digital converter includes a primary delay line and a timer delay line. The primary delay line is powered by the voltage to be converted and the timer delay line is powered by a known reference voltage. A signal is propagated through the timer delay line to provide a signal that enables the capture of the distance a test signal propagates through the primary line during the period of signal propagation through the timer delay line. The process of analog-to-digital conversion is preferably complete upon converting the signal propagation distance into thermometer code and/or other digital formats.

The invention provides a method for measuring a parameter selected from the group consisting of voltage, temperature, and integrated circuit process conditions, the method comprising: providing a primary delay line and a timer delay line; applying an input voltage to the primary delay line; applying a reference voltage to the timer delay line; propagating a delay signal through the primary delay line; propagating a timer signal through the timer delay line; establishing a first sampling period based on the timer signal propagation; measuring a first extent of delay signal propagation along the primary delay line during the first established sampling period; and using the delay signal propagation first extent to provide an output signal characteristic of one or more of the parameters. Preferably, propagating the delay signal comprises cycling the delay signal through the primary delay line a plurality of times, and propagating the timer signal comprises cycling the timer signal through the timer delay line a plurality of times. Preferably, using comprises finding the difference between a timer delay extent of propagation through the timer delay line and a corresponding primary delay first extent of propagation through the primary delay line to determine a difference code. Preferably, providing a primary delay line and a timer delay line comprises providing a primary delay ring and a timer delay ring, and finding the difference comprises counting a predetermined number of cycles of the timer signal through the timer delay ring and counting the number of cycles of the delay signal through the primary delay ring while the timer signal cycles through the predetermined number of cycles. Preferably, using further comprises a gain calibration and/or mismatch correction. Preferably, using comprises converting the output logic states into digital code or thermometer code. Preferably, providing comprises incorporating the primary delay line and the timer delay line into a single integrated circuit. Preferably, providing comprises forming the primary delay line and the timer delay line sufficiently close to one another in the integrated circuit so that they are substantially always at the same temperature.

The invention also provides an analog-to-digital converter (ADC) comprising: a source of an input voltage; a source of a reference voltage; a primary delay line connected to the source of an input voltage, and having a delay signal input and a plurality of tap outputs; a timer delay line connected to the source of a reference voltage and having a timer signal input and a timer signal output; a delay signal source connected to the delay signal input and the timer delay signal input, and a digital output circuit coupled to the tap outputs and the timer signal output to provide a digital output indicative of a difference between the input voltage and the reference voltage. Preferably, the ADC is implemented entirely with digital logic gates and includes no analog components. Preferably, the primary delay line and the timer delay line are incorporated into a single integrated circuit. Preferably, the delay signal source simultaneously provides a delay signal to the delay signal input and a timer signal to the timer signal input. Preferably, the delay signal and the timer signal as provided by the delay signal source are the same signal. Preferably, the digital output circuit comprises an array of flip-flop circuits. It may also include a counter and/or a shift register in some embodiments. The primary delay line and/or the timer delay line may be a flat delay line or a folded delay line. Preferably, the digital output circuit includes a gain calibration circuit, a mismatch correction circuit, or both.

The invention further provides a method for converting an analog voltage to a digital signal, the method comprising: applying an analog input voltage to delay cells in a primary delay line; propagating a delay signal through the primary delay line; adjusting a sampling period for the delay signal propagation based on factors affecting a speed of the delay signal propagation other than the analog input voltage; measuring an extent of delay signal propagation during the adjusted sampling period; and responsive to the measured extent of propagation, providing a digital output signal indicative of a magnitude of the analog voltage. Preferably, adjusting comprises adjusting the sampling period for temperature variation in the primary delay line. Preferably, adjusting comprises adjusting the sampling period in response to process conditions in the primary delay line. Preferably, adjusting comprises: providing a timer delay line having delay cells powered by a reference voltage; propagating a timer signal through the timer delay line; and establishing the sampling period based on a duration of the timer signal propagation through the timer delay line. Preferably, measuring comprises determining output logic states of the delay cells at an end of the adjusted sampling period. Preferably, providing comprises expressing the digital output signal in digital code, such as thermometer code.

Generally, the extent of signal propagation along a delay line is a function of the value of the supply voltage to devices forming the delay line, the temperature of the delay line, and the process conditions of the delay line. Since the timer delay line is preferably manufactured on the same integrated circuit (IC) as the primary delay line, thereby ensuring constant process conditions between the two lines and the two lines are located sufficiently close to one another on the same IC that they are at substantially identical temperatures, the difference in propagation distances through the primary line and the timer delay line is entirely due to any voltage difference between the voltage to be converted and the reference voltage. By compensating for the effects of temperature and process conditions on signal propagation speed, the signal propagation distance occurring within an adjusted sampling period preferably reflects the supply voltage very accurately. The above and other advantages of the present invention may be better understood from a reading of the following description of the preferred exemplary embodiments of the invention taken in conjunction with the drawings in which:

DETAILED DESCRIPTION OF THE PREFERRED EMBODIMENT

Figure 1:
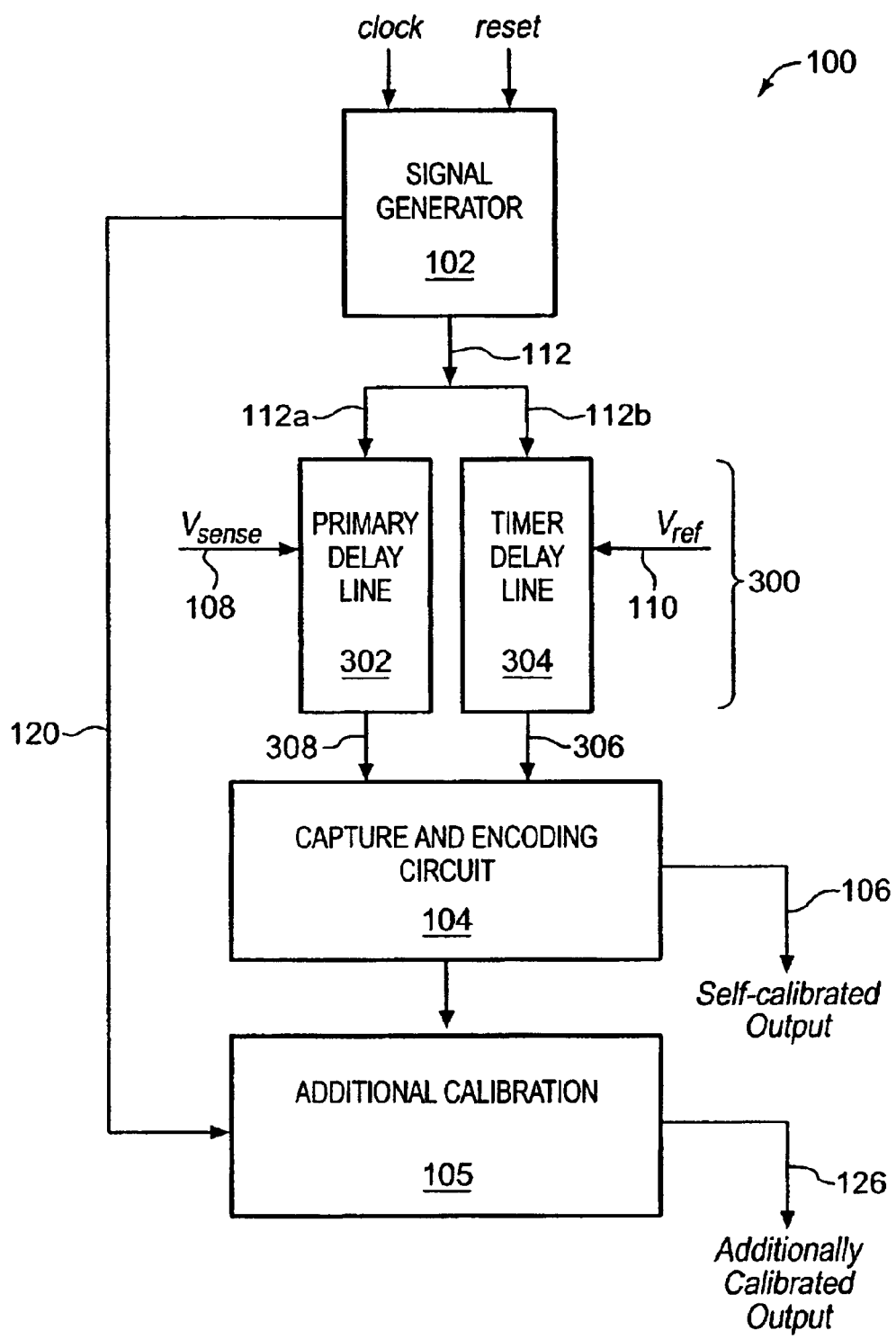
FIG. 1 is a block diagram of a matched delay line ADC system according to a preferred embodiment of the present invention.
Figure 3:
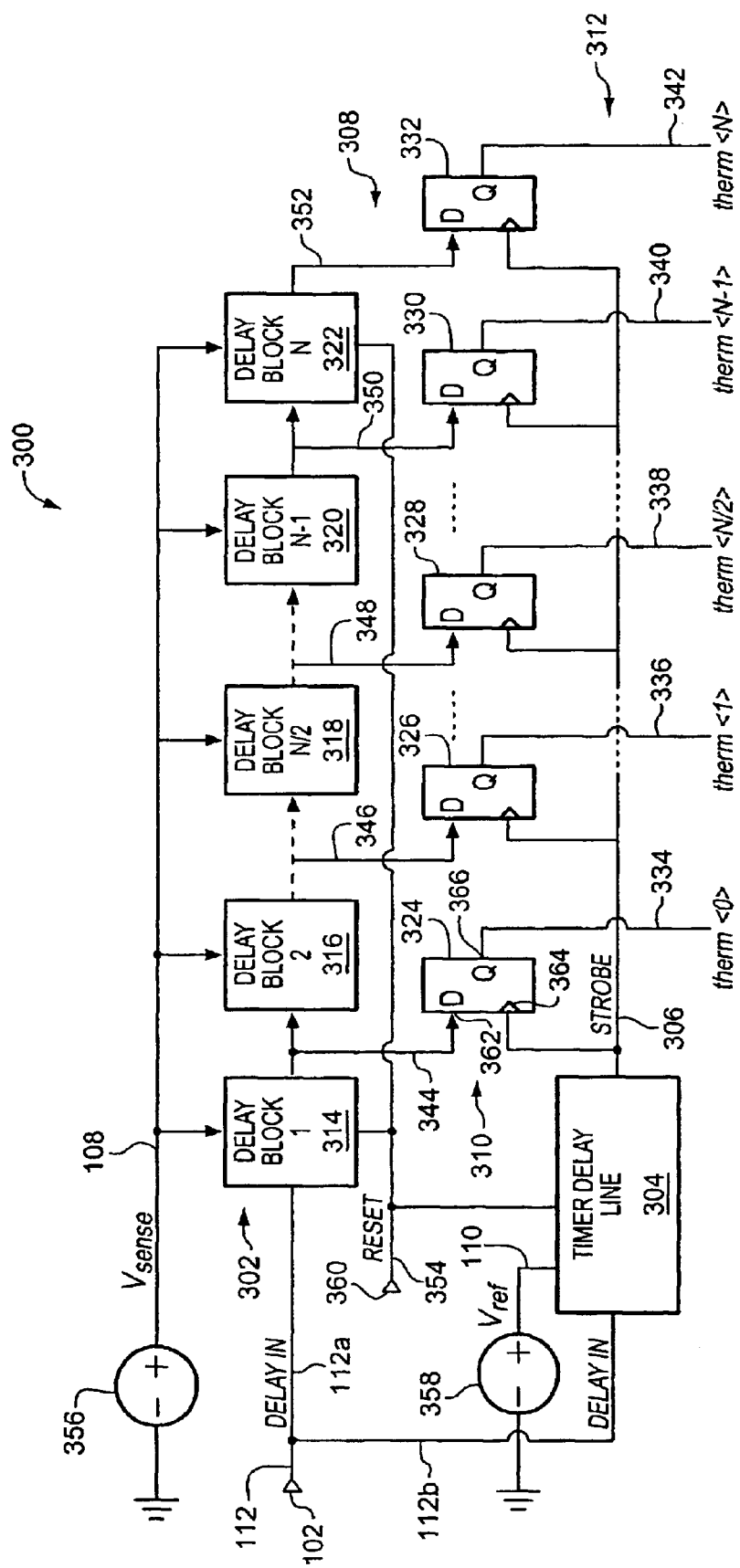
FIG. 3 is a block diagram of a flat version of a matched delay line ADC according to a preferred embodiment of the present invention.

FIG. 1 is a system-level block diagram of a matched delay line ADC system 100 according to a preferred embodiment of the present invention. System 100 includes signal generator 102, primary delay line 302, timer delay line 304, capture and encoding circuit 104 and additional calibration circuit 105. Primary delay line 302 is preferably powered by $V_{sense}$ applied to line 108 by voltage source 356 (FIG. 3). Timer delay line 304 is preferably powered by $V_{ref}$ applied on-line 110 from voltage source 358 (FIG. 3). Signal generator 102 provides a signal on line 112 which preferably serves as a source for both a delay signal on delay signal input 112a directed to primary delay line 302 and a timer signal on timer signal input 112b directed to timer delay line 304. Signal generator 102 also applies a calibration signal on line 120 to additional calibration circuit 105. Upon the propagation of the timer signal through timer delay line 304, a strobe signal is provided on timer signal output 306 which preferably enables capture and encoding circuit 104 to capture the output of primary delay line on tap outputs 308, and thus determine the distance the delay signal has propagated through primary delay line 302 in the time it took the timer signal to propagate through timer delay line 304. This distance is proportional to the input voltage $V_{sense}$. The capture and encoder circuit then outputs on output 106 a digital signal representative of the magnitude of the analog voltage $V_{sense}$, thus converting the analog signal to a digital signal. Output 106 is self-calibrated in that the matched delay line system 300 automatically calibrates the output for temperature and process variations.

Though the matched delay line structure provides a self-calibrated reference point over temperature and process variations, it is possible that the step-size of the A/D characteristic will change with process and temperature. The additional calibration block 105 uses the value of a counter associated with the timer delay line 304, which counter is latched for a fixed time after the input pulse is sent down the line. If there are process or temperature variations that would affect the step-size of the AND characteristic, they show up in the form of a variation in this count from what it is under typical process and temperature conditions. The calibration block 105 takes this latched count value along with the uncalibrated output code as inputs. It then compares the latched count to known process corners, and outputs a calibrated code on output 126 according to the process or temperature corner dictated by the count. The output of this block is a two's compliment binary representation of the sensed voltage. If a two's compliment is unacceptable, this block can also re-encode the output to the desired format. For instance, the output can be addresses associated with a look-up table which creates codes in ascending order starting at zero, corresponding to one end of the A/D characteristic.

In this disclosure, "analog devices" include passive components such as resistors, inductors, and capacitors, and transistor-based devices operating in their gain stages. Herein, the term "analog components" is used interchangeably with the term "analog devices". The term "delay signal" refers to a signal propagating through primary delay line 302, while the term "timer signal" refers to a signal propagating through timer delay line 304. Herein, "digital logic gates" include AND, NAND OR, and NOR gates and other active electronic components providing discrete logic-1 or logic-0 output states. Herein, "signal propagation distance" is a distance measured in delay blocks and/or delay cells through which a delay signal or timer signal has propagated in a time period, such as a sampling period. Herein, the term "signal propagation extent" is used interchangeably with the term "signal propagation distance". The term "signal propagation speed" is a rate at which a delay signal or timer signal propagates through a sequence of delay blocks and/or delay cells. The term "temperature/process corner" refers to a particular set of temperature and process conditions for which there is a significant difference in the speed of the IC as compared to other temperature process corners. Essentially, the term "corner" is used herein as a proxy for the "speed" of the IC, since the combination of temperature and process effectively determine the speed at which a signal will propagate as a function of the voltage.

Figure 2:
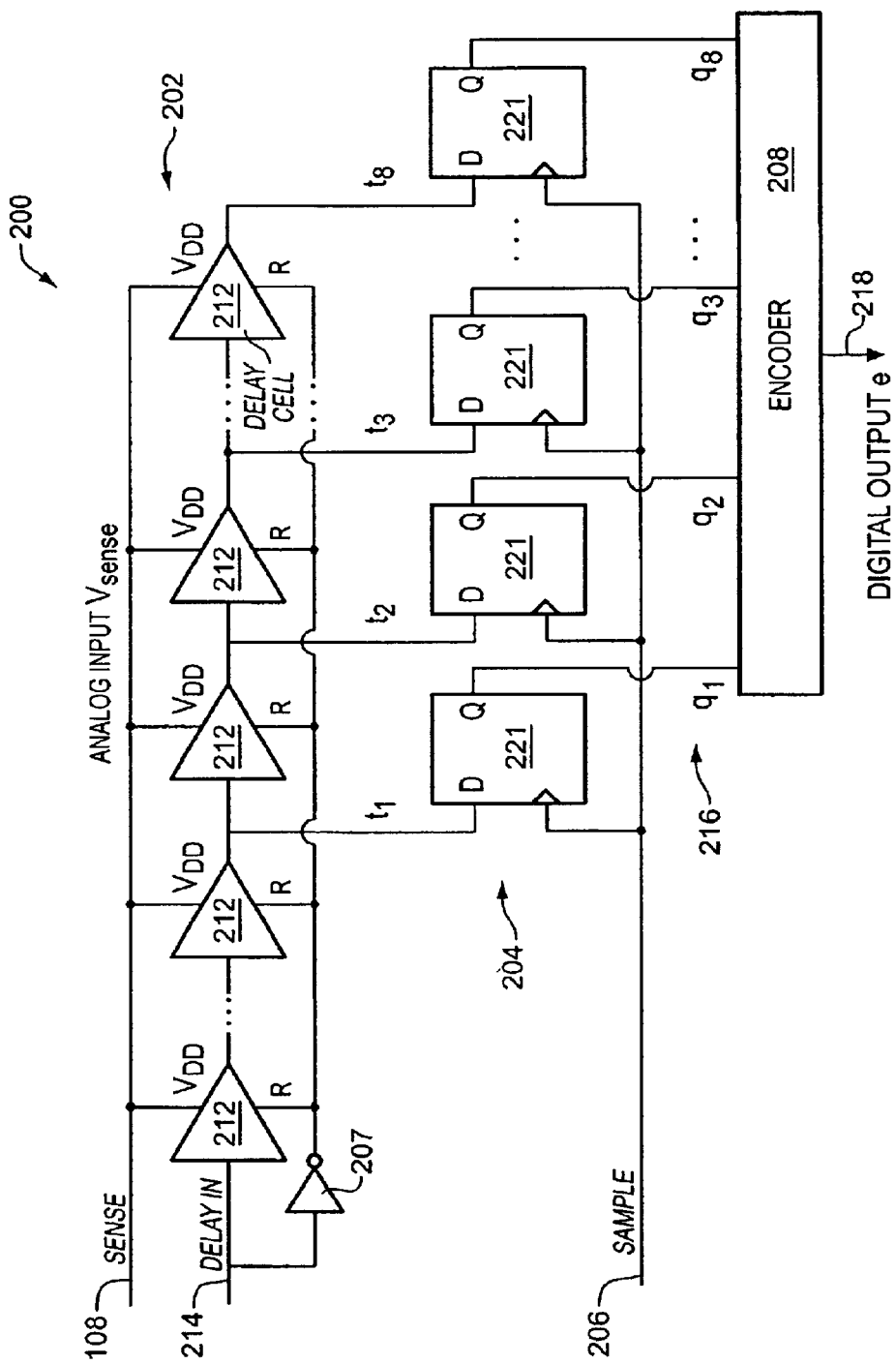
FIG. 2 is a block diagram of a basic delay line ADC.

FIG. 2 is a block diagram of a basic delay line ADC 200, as disclosed in PCT Application PCT/US02/39189 filed Dec. 9, 2002, which is hereby incorporated by reference to the same extent as though fully disclosed herein. ADC 200 includes a delay cell array 202 comprising a plurality of delay cells 212 connected in series. Delay cells 212 are preferably logic gates. A DELAY IN signal is applied to the input of the first delay cell 212 and also to the input of an inverter 207, the output of which applies a reset signal R to the reset input of each of delay cells 212. Taps t1, t2, t3, . . . t8 are connected to the outputs of the delay cells 212 beyond a predetermined number of cells. The taps t1, t2, t3, . . . t8 are connected to the D inputs of corresponding flip-flops 221 in flip-flop array 204. A SAMPLE signal on line 206 is applied to the clock inputs of flip-flops 221. The Q outputs of each of the flip-flops 221 in array 204, providing output signals q1, q2, q3, . . . q8, are connected to encoder 208. The output 218 of encoder 208 is a digital error signal e.

ADC 200 operates on the principle that signal propagation speed varies substantially proportionately with supply voltage $V_{DD}$ applied to the delay cells. In the embodiment of FIG. 2, as well as other embodiments discussed herein, $V_{sense}$ on line 108 is equal to $V_{DD}$, the supply voltage to delay cells 212, although this is not essential to the invention. At the beginning of a switching cycle, a DELAY IN pulse is applied to line 214 connected to the input of the first delay cell 212 to cause a delay signal to propagate through delay cell array 202. After a fixed conversion-time interval, preferably equal to three-quarters of the sampling period of the SAMPLE signal, taps t1 to t8 are sampled. The result of this sampling is preferably temporarily stored in flip-flop array 204 and then transmitted to encoder 208 via flip-flop output array 216. The outputs q1, q2, q3, . . . q8 to encoder 208 are preferably in the form of "thermometer code". Encoder 208 preferably converts the thermometer code into digital output "e" 218. Digital output 218 is preferably in a form more suitable for use in a data processing apparatus (not shown) than thermometer code outputs q1, q2, q3, . . . q8. It will be appreciated that encoder 208 may provide digital output 218 in a wide range of digital data formats.

The lower the value of $V_{sense}$, the longer the cell delay $t_d$, and the delay pulse preferably propagates to fewer taps. The higher the value of $V_{sense}$, the shorter the cell delay, and the delay pulse propagates to more taps. Accordingly, the extent of propagation of delay pulse 214, within a fixed time period, provides a measure of the magnitude of $V_{DD}$, and in the preferred embodiment, $V_{sense}$.

In the embodiment of FIG. 2, the length of delay cell array 202 effectively determines a reference value, $V_{ref}$, on which the ADC 200 conversion characteristic is centered. The number of taps and the tap delay preferably determine the range $(\Delta V_{DD})_{max}$ and the effective LSB resolution $\Delta V_{DD}$ of ADC 200.

In one embodiment, the delay line is established so that the LSB resolution of $\Delta V_{DD}$=40 mV, and the reference voltage, $V_{ref}$, is 2.5V. In this embodiment, digital output e on line 218 is a digital representation of the difference between the measured voltage, $V_{sense}$, and the reference voltage (not shown). Preferably, when $V_{sense}$ equals $V_{ref}$, digital output e has a value of 0.

An important advantage of delay-line ADC 200 is noise immunity. One contributing factor to this immunity is the averaging of $V_{sense}$ over the time period during which delay pulse propagation is measured. Another factor is the relative immunity of the thermometer code output to noise spikes.

In the embodiment of FIG. 2, the value of $V_{ref}$ is indirectly determined by the length of delay cell array 202 and the delay-versus-voltage characteristic of delay cells 212. Significantly, the disparity between $V_{sense}$ and $V_{ref}$ is determined by ADC 200 without employing an analog comparator. Accordingly, the burdens of increased power consumption, high space requirements, and dependency on the degree of precision of analog component design are beneficially avoided in the embodiment of FIG. 2.

In practice, because of process and temperature variations, the reference voltage, $V_{ref}$, provided by ADC 200 is difficult to precisely control. Variations in temperature and in the process conditions of delay cells 212 may cause signal propagation delay in delay cell array 202 to fluctuate independently of $V_{sense}$. The resulting variations in $V_{ref}$ generally may cause variations in the value of digital output e on line 218 for a given value of $V_{sense}$. Accordingly, it is desirable to control and/or eliminate the effects of temperature and process conditions on the value of digital output e.

In the embodiments shown in the following figures, the problems of temperature and process condition-induced influence over signal propagation speed through delay cells are addressed by varying the duration of the sampling period, sometimes referred to as a "first sampling period" to distinguish it from other sampling periods discussed herein, during which a delay pulse signal propagates through an array of delay cells. In the basic delay line ADC 200 of FIG. 2, measurement of signal propagation distance, or extent, within a fixed time period effectively measures the effects of three variables on such signal propagation distance while attributing this signal propagation distance to just one of the variables. Specifically, variation in signal propagation speed depends on variation in supply voltage to the delay cells, temperature, and process conditions.

In the preferred embodiments discussed in the following figures, the duration of the first sampling period during which signal propagation distance is measured through a primary delay line is varied with temperature and process conditions. The sampling period is preferably varied to the same degree but in the opposite direction, as is the signal propagation speed through the primary delay line. In this way, temperature and/or process condition effects which increase the propagation speed by, for example, 10% (over a baseline set of initial conditions), preferably decrease the sampling period by this same proportion, thereby yielding the same signal propagation distance for an unchanged supply voltage to the delay cells of the primary delay line.

Preferably, a common DELAY IN signal on line 112 is directed both to a primary delay line 302 and to a timer delay line 304 (FIG. 1). The timer delay line preferably has a length equal to some fraction of the length of the primary delay line and is preferably manufactured on the same chip as the primary delay line, thereby causing both delay lines to experience all the same process conditions. Moreover, the timer delay line is located in the same environment as the primary delay line and therefore preferably experiences substantially identical temperature conditions.

FIG. 3 is a block diagram of a flat version 300 of a matched delay line ADC according to a preferred embodiment of the present invention. A flat delay line is one in which a delay pulse signal propagates only once through a selection of delay blocks 302 of the delay line during a single voltage conversion operation. In contrast, in a folded delay line, a delay pulse signal may cycle several times through a delay ring forming part of a delay line or delay circuit for a single voltage conversion operation.

In the embodiment of FIG. 3, matched delay line ADC 300 includes primary delay line 302, timer delay line 304, sense voltage source 356, reference voltage source 358, signal generator 102, RESET signal source 360, tap line output array 308, flip-flop array 310, and flip-flop output array 312. Primary delay line 302 preferably includes delay blocks 1 through N; tap line output array 308 includes tap line outputs 344, 346, 348, 350, and 352; flip-flop array 310 includes flip-flops 324, 326, 328, 330, and 332; and flip-flop output array 312, also known as thermometer code output 312, includes flip-flop outputs 334, 336, 338, 340, and 342. One side of $V_{sense}$ voltage source 356 is grounded and the other side is attached to the voltage inputs of delay blocks 302 via line 108. One side of $V_{ref}$ source 358 is grounded and the other side is connected to timer delay line 304 via line 110. The DELAY IN signal generator 102 is connected to the input of delay block 314 via line 112a and to the input of timer delay line 304 via line 112b. The output of each delay block, such as Delay Block 1, is connected to the input of the next delay block, such as Delay Block 316, when there is a next delay block, and to the D input, such as 362, of its corresponding flip-flop, such as flip-flop 324, in flip-flop array 310 via the corresponding tap line, such as tap line 344, in tap line array 308. The output of timer delay line 304 provides a STROBE signal that is applied to the clock input, such as 364, of each of the flip-flops in flip-flop array 310. The Q outputs, such as 366, of flip-flops 310 provide the thermometer code signals therm <0> through therm <N> on lines 334 through 342 of flip-flop output array 312. Each delay block in primary delay line 302 preferably includes one or more delay cells. In a preferred embodiment, flip-flop array 310 is the digital output circuit operative to transmit the digital logic states of delay cells in primary delay line 302. However, other digital output circuits may be employed. Exemplary delay blocks and delay cells are discussed in FIGS. 4 and 5, respectively, after which discussion returns to the operation of ADC 300 of FIG. 3.

Figure 4:
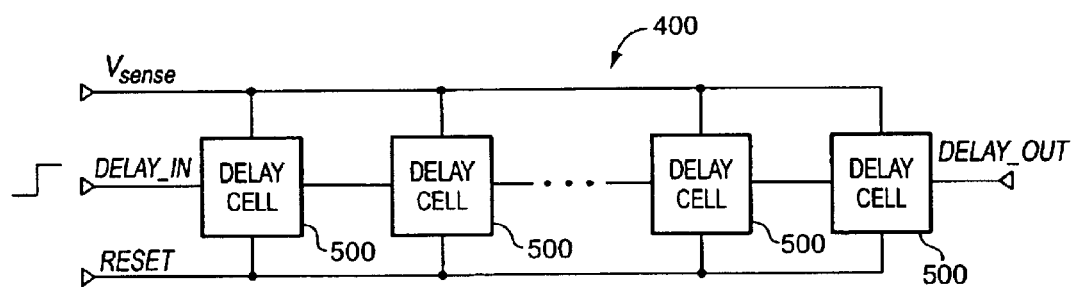
FIG. 4 is a block diagram of an exemplary delay block of the matched delay-line ADC of FIG. 3.

FIG. 4 shows one exemplary delay block 400 including a plurality of delay cells 500 connected in series with the output of one delay cell connected to the input of the next delay cell. Each delay block 400 has a voltage input to which $V_{sense}$ is applied and a reset input to which the RESET signal is applied. Delay block 400 may correspond to one or more of the delay blocks of FIG. 3. It will be appreciated that delay block 400 may include a number of delay cells 500 varying from one to infinity.

Figure 5:
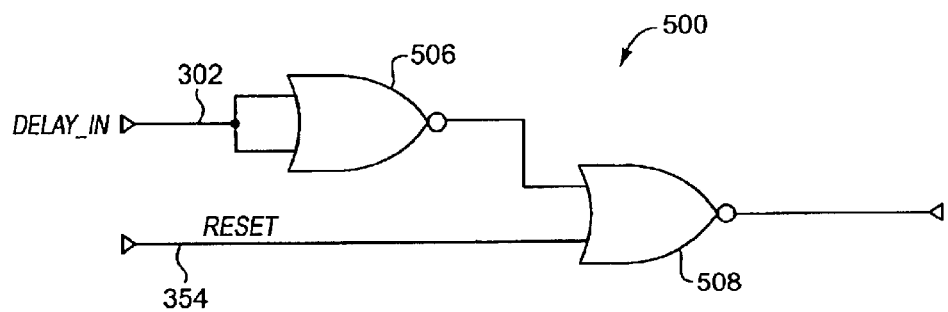
FIG. 5 is a schematic diagram of an exemplary delay cell of the delay block of FIG. 4.

FIG. 5 shows one exemplary delay cell 500 implemented with NOR gates 506 and 508. The DELAY IN signal is applied to both inputs of NOR gate 506. The RESET signal and the output of NOR gate 506 are applied to the inputs of NOR gate 508. The output of NOR gate 508 provides the output of the delay cell 500. It will be appreciated that a wide range of different digital logic gates could be used to implement the function of delay cell 500.

Returning to FIG. 3, in the preferred embodiment, timer delay line 304 comprises a duplication of Delay Block 1 314 through Delay Block N/2 318 of primary delay line 302 and a selection of additional cells 500 to generate a small additional delay. The purpose of the additional delay is to aid in precisely centering the analog-to-digital conversion characteristic on the reference voltage. This adjustment may be needed if there are minor differences in propagation time through essentially identical portions of delay lines 302 and 304. Preferably, the delay cells in timer delay line 304 are powered by the reference voltage, $V_{ref}$ on line 110. Preferably, $V_{sense}$ on line 108 provides operating power to the delay cells in primary delay line 302. This scheme is designed to lead to a thermometer code output having a zero value when $V_{sense}$ equals $V_{ref}$.

An overview of the quantities of interest is helpful in understanding the description of a typical conversion operation below. The input to ADC 300 is $V_{sense}$, an analog voltage to be converted into a digital value, in this case, thermometer code 312. The reference voltage, $V_{ref}$, with which $V_{sense}$ will be compared, is incorporated into the design of ADC 300 and powers the delay cells of timer delay line 304.

Generally, an input voltage $V_{sense}$ value equal to $V_{ref}$ will cause the delay signal on line 112a to propagate to the end of delay block N/2 318 in a single sampling period, as adjusted by timer delay line 304. This will be true even with temperature variation and with variation in process conditions from one ADC 300 chip to another because of the operation of timer delay line 304.

The propagation speed of the delay signal on line 112a through primary delay line 302 will vary substantially proportionately with the value of $V_{sense}$. Variation in process conditions from one ADC 300 chip to another and temperature variation in primary delay line 302 can also affect this propagation speed. However, the influence of temperature and ADC 300 chip process conditions on signal propagation speed through timer delay line 304, and by extension on the sampling period resulting therefrom, ensures that delay signal propagation distance is a function substantially only of $V_{sense}$.

A typical conversion operation is now considered. Preferably, before providing the DELAY IN signal, each delay cell receives a RESET signal on line 354, preferably a high signal, which brings all cells in delay lines 302 and 304 to a known initial state prior to initiating a voltage conversion operation. RESET signal source 360 is then preferably set low. Signal generator 102 then preferably provides the DELAY IN signal on line 112 to ADC 300. This signal is preferably split into a signal on line 112a, which is directed to primary delay line 302, and a signal on line 112b, which is directed to timer delay line 304. The delay signal and the timer signal then preferably propagate along their respective delay lines.

As the delay signal propagates through delay line 302, tap lines within tap line array 308 are switched to a condition indicating that they have been switched by delay signal 112a. This "switched" condition may be either a logic-1 or logic-0 condition. Each of the tap lines preferably transmits its status to its corresponding flip-flop within flip-flop array 310. Delay-signal-on line 112a preferably continues to propagate until the timer signal on line 112b completes its propagation through timer delay line 304 and turns on strobe signal 306.

Once timer signal propagation ends, strobe signal 306 preferably samples flip-flops within flip-flop array 312, thereby providing thermometer code output 312. In this manner, ADC 300 beneficially provides a digital output indicative of the extent of propagation time through primary delay line 302 during the period determined by the propagation through timer delay line 304, which we sometimes refer to as the "first extent" of propagation to distinguish it from other propagation distances discussed below. This digital output is indicative of the difference in magnitude between input voltage $V_{sense}$ and $V_{ref}$. The output is preferably independent of temperature and process condition variations.

Typically, signal propagation speed through delay line 302 is a function of input voltage $V_{sense}$, temperature, and conditions arising from the manufacturing process of each particular ADC 300 chip (process conditions). The embodiment of FIG. 3 compensates for temperature and process conditions to ensure that output 312 is indicative of voltage alone. It will be appreciated that others of the three factors causing variation in signal propagation speed may be measured by holding the other variables constant.

Specifically, signal propagation speed through a delay line can be used to measure temperature by holding supply voltage (the voltage powering the delay cells) and process conditions constant. Process conditions are inherently constant as long as the temperature of a single chip is measured. The delay line can be calibrated by storing a digital value corresponding to a signal propagation distance during a sampling period occurring at an initial, known temperature. Thereafter, as the temperature varies, with supply voltage and process conditions unchanged, digital representations of signal propagation distances (or speeds) at unknown temperatures can be compared to the stored calibration value to determine the unknown temperature.

Similarly, variation in signal propagation distance or speed between different ADC 300 chips, which are at the same temperature and which are powered by the same supply voltage, can be measured. This measurement can provide insight into the effects of certain manufacturing process parameters over signal propagation characteristics of the resulting manufactured devices.

Effective design of matched delay line ADC 300 includes selecting the number of delay cells in each of the delay blocks and the number of taps N to be sampled. The number of cells in a delay block is preferably selected so that the LSB value of ADC 300 has a desired value $V_q$. Because of variation in temperature and process conditions, $V_q$ varies somewhat. The specifications usually call for a certain maximum allowed LSB value. Therefore, the number of cells in a delay block should be selected so that this value is met at the worst-case (slowest) process/temperature corner. The number of observed taps N is selected to provide a desired conversion range for a given ADC.

Figure 6:
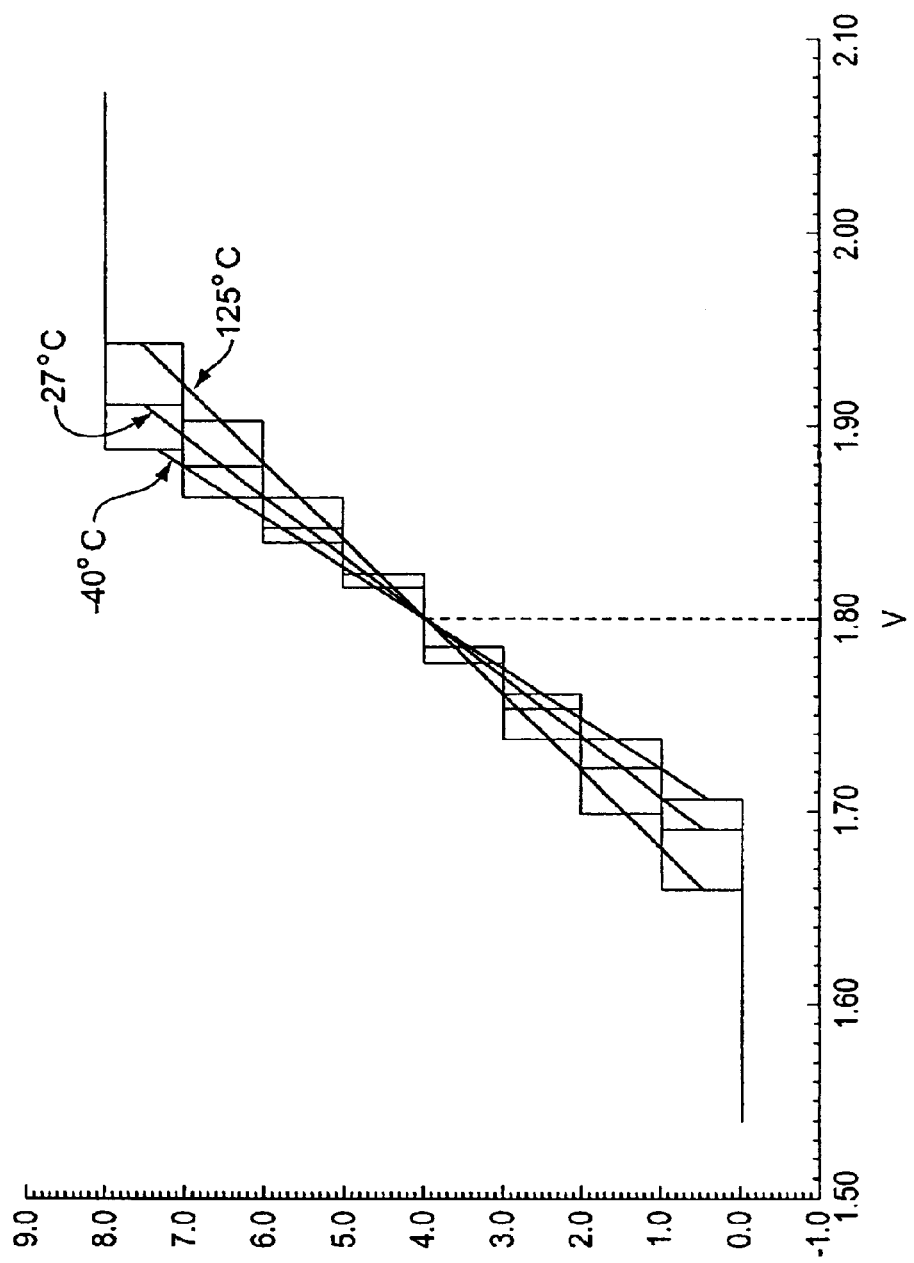
FIG. 6 is a plot of output code of the ADC of FIG. 3 as a function of analog input voltage at three different temperatures.

FIG. 6 shows characteristics obtained by simulation of ADC 300 of FIG. 3 at a slow process corner for three operating temperatures, with $V_{ref}$ having a value of 1.8 V. From the simulation results, the condition in which $V_{in}=V_{ref}$ results in the zero-error output (output code "4") over a wide range of temperature and process variations.

Figure 7:
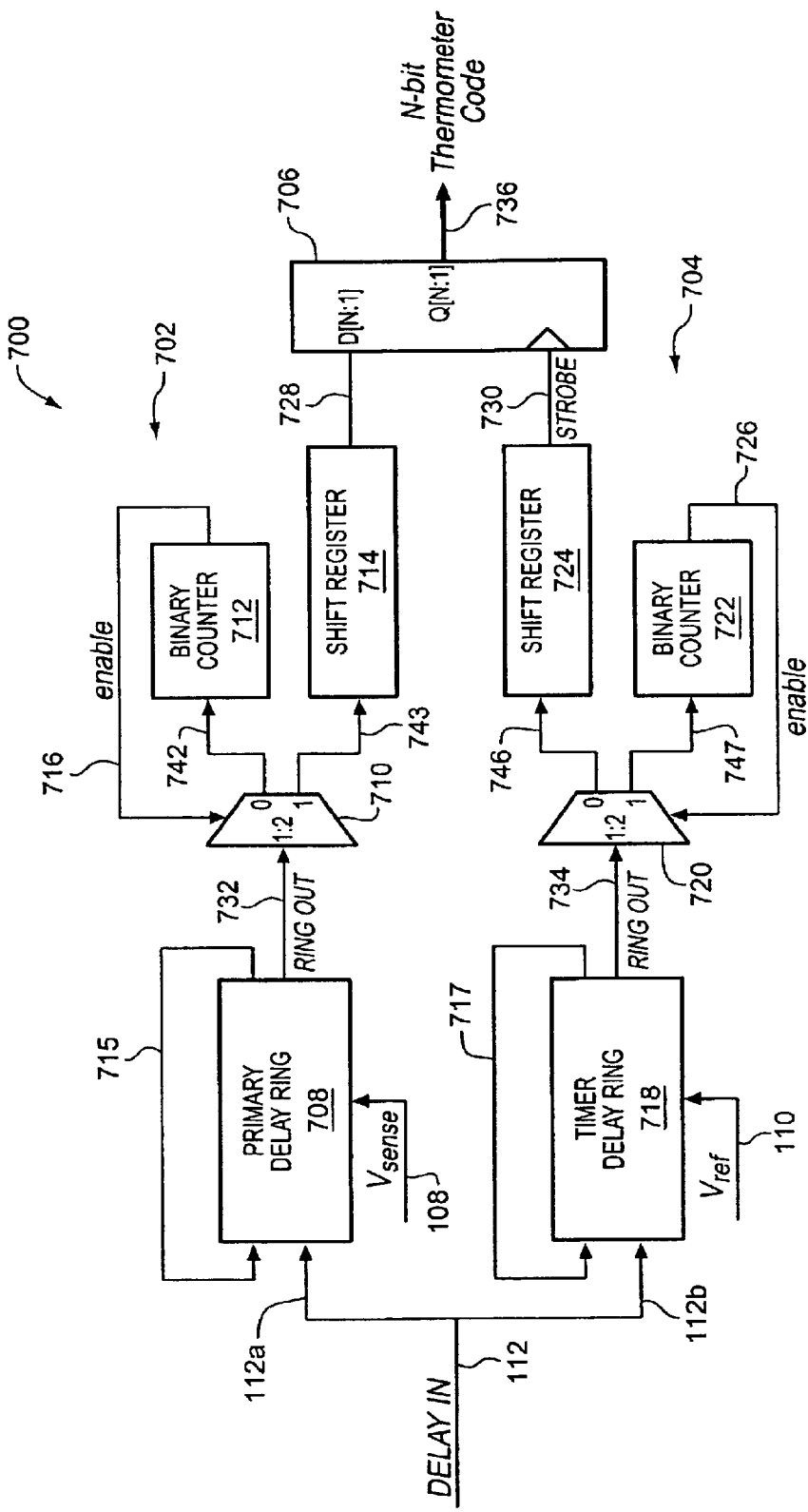
FIG. 7 is a block diagram of a folded version of a matched delay-line ADC according to a preferred embodiment of the present invention.

FIG. 7 is a block diagram of a folded matched delay-line ADC 700 according to a preferred embodiment of the present invention. ADC 700 preferably includes primary delay circuit 702, timer delay circuit 704, and flip-flop circuit 706. Primary delay circuit 702 preferably includes primary delay ring 708, multiplexer (mux) 710, binary counter 712, and shift register 714. Timer delay circuit 704 preferably includes timer delay ring 718, mux 720, binary counter 722, and shift register 724. As before, $V_{sense}$ is applied to primary delay ring 708 on line 108 and $V_{ref}$ is applied to timer delay ring 718 on line 110, and the DELAY IN signal is provided on lines 112a and 112b to primary delay ring 708 and timer delay ring 718, respectively. The delay signal propagates through primary delay ring 708 and then, in a manner to be discussed below, is recycled to the beginning of the ring via line 715. The timer signal propagates through timer delay ring 718 and then, in a manner to be discussed below, is recycled to the beginning of the ring via line 717. The output of primary delay ring 708 is connected to the input of multiplexer 710 via line 732, and the output of timer delay ring 718 is connected to the input of multiplexer 720. One output of multiplexer 710 is connected to the input of binary counter 712 via line 742, while the other output is connected to shift register 724 via line 743. One output of multiplexer 720 is connected to shift register 724 via line 746, while the other output is connected to binary counter 722 via line 747. The output of shift register 714 is coupled to the D input of flip-flop 706 via line 728, and the output of shift register 724 is coupled to the clock input of flip-flop 706 via line 730. The output of flip-flop 706 provides an N-bit thermometer code on line 736. The composition of delay rings 708 and 718 is discussed in connection with FIGS. 8 and 9 below, after which discussion returns to the operation of ADC 700 of FIG. 7.

Figure 8:
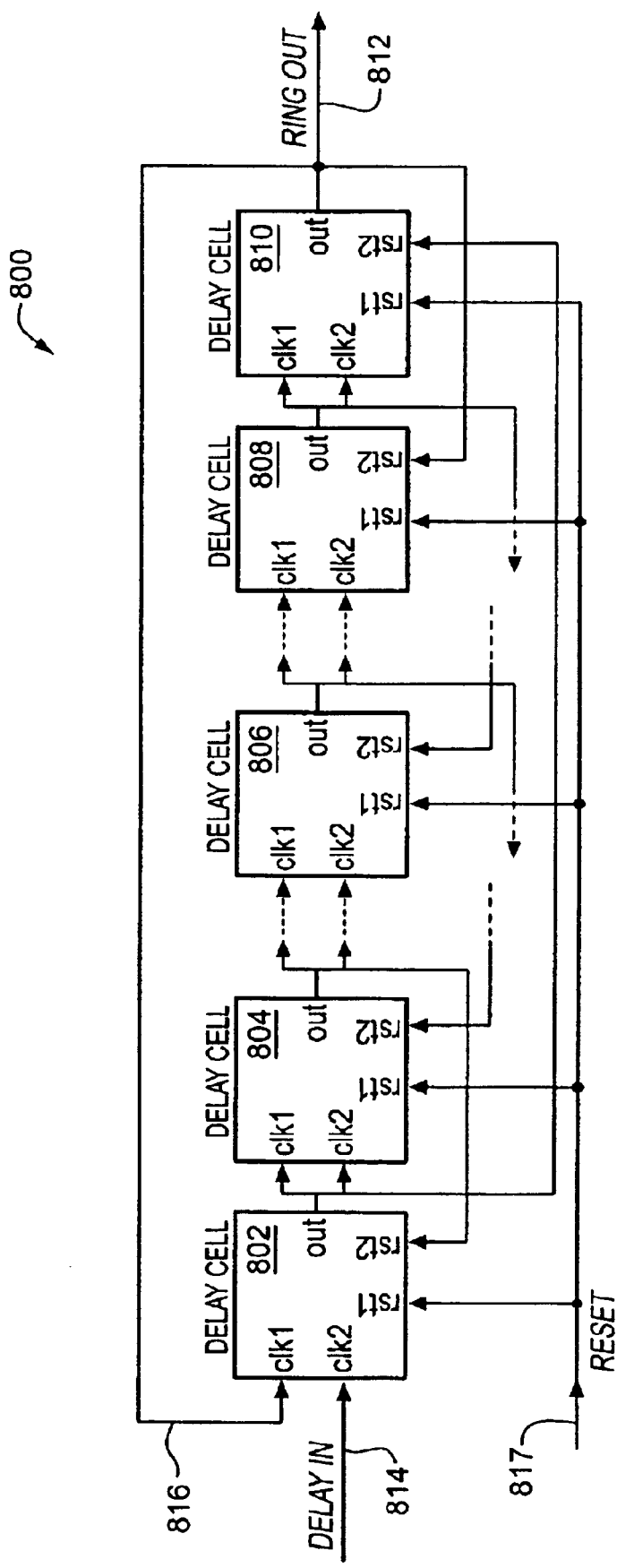
FIG. 8 is a block diagram of an exemplary one of the delay rings of FIG. 7.

Turning to FIG. 8, ring 800 is an exemplary delay cell and may correspond to either or both of primary delay ring 708 and timer delay ring 718 of FIG. 7. Ring 800 comprises a plurality of delay cells, five of which are shown as cells 802, 804, 806, 808, and 810. The DELAY IN signal is applied to the clock 2 input of delay cell 802 via line 814, which may be either line 112a or 112b. The output of delay cell 802 is connected to the clock 1 and clock 2 inputs of delay cell 804 and to the reset 2 input of delay cell 810. Likewise the output of each delay cell, except the last, is connected to the clock 1 and clock 2 inputs of the next delay cell and the reset 2 input of the previous delay cell. The output of the last delay cell 810 is connected to the clock 1 input of the first delay cell 802 and provides a RING OUT signal on line 812, which can be either line 732 or 734.

Figure 9:
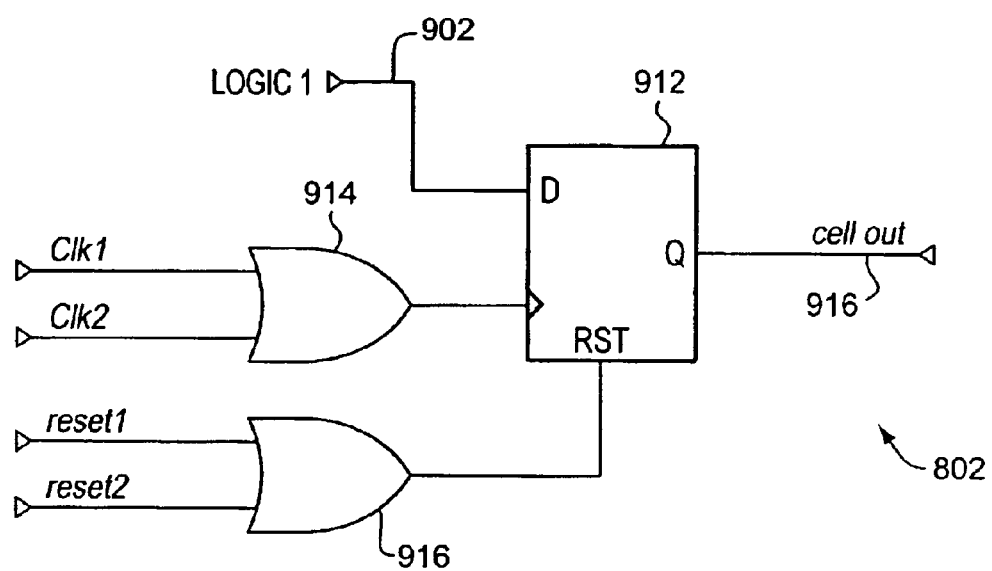
FIG. 9 is a schematic diagram of an exemplary delay cell of the delay ring of FIG. 8.

FIG. 9 is schematic diagram of an exemplary ring cell 802 of delay ring 800 of FIG. 8. Ring cell 802 preferably includes flip-flop 912, and OR gates 914 and 916, all of which are preferably powered by a supply voltage which is equal either to $V_{sense}$ or $V_{ref}$, depending upon whether ring cell 802 is located in primary delay ring 708 or timer delay ring 718, respectively. The D input of flip-flop 912 is preferably permanently connected to a source of logic 1 voltage. The clock 1 and clock 2 inputs are connected to the inputs of OR gate 914, and the reset 1 and reset 2 inputs are preferably connected to the inputs of OR gate 916. The output of OR gate 914 is connected to the clock input of flip-flop 912 and the output of OR gate 916 is connected to the reset input of flip-flop 912. The Q output of flip-flop 912 provides the cell output on line 916. Preferably, when either one of reset 1 or reset 2 is activated, output signal 916 is preferably reset to logic 0. If neither reset 1 908 nor reset 2 910 is active, a rising edge on either one of clock input 1 or clock input 2 preferably causes flip-flop 912 output 916 to rise to logic 1.

Returning to FIG. 8, a RESET signal is applied to the reset 1 input of each of cells 802, 804, etc. of delay ring 800 via line 817. Initially, the DELAY IN signal is transmitted to cell 802 and a delay signal propagates through delay ring 800. For each propagation stage, the propagation of the delay signal to a succeeding cell preferably resets the status of a preceding cell. When the delay signal reaches cell 810, the final cell in delay ring 800, it emerges as the RING OUT signal on line 812. Preferably, one branch of the RING OUT signal is redirected back to cell 802 as clock 1 signal on line 816, which redirection completes a single loop of delay ring 800. Upon completion of this loop, the RING OUT signal on line 812 preferably causes a counter, which is either counter 712 or counter 722 in FIG. 7, to increment by one count.

In ADC 700 of FIG. 7, one cycle of primary delay ring 708 preferably performs the same function as delay block 314 in flat primary delay line 302 of FIG. 3. Similarly, one cycle of timer delay ring 718 effectively replaces a delay block within timer delay line 304 corresponding to delay block 314. Causing a signal to cycle several times through a small number of delay cells in a delay ring can generate the same delay as a single trip through a long delay block having a very large number of delay cells. Accordingly, delay rings 708 and 718 preferably enable ADC 700 to use less hardware and consume less space in an integrated circuit than does delay block 314 of ADC 300.

A typical conversion operation is now considered. Preferably, signal generator 102 (FIG. 1) provides a DELAY IN signal on line 112, which, in turn, simultaneously provides a DELAY IN signal to primary delay ring 708 on line 112a and to timer ring 718 on line 112b. Preferably, the delay signal cycles around primary delay ring 708, incrementing binary counter 712 with each completed loop, until a predetermined number of loops is completed. Binary counter 712 then provides an enable signal to multiplexer on line 716, which causes the multiplexer to increment shift register 714 via its "1" output. This cycle continues to propagate a signal in shift register 714 until a STROBE signal is activated on line 730.

Preferably, the timer signal cycles around primary delay ring 718, incrementing binary counter 722 with each completed loop, until a predetermined number of loops is completed. Binary counter 722 then provides an enable signal to multiplexer on line 726, which causes the multiplexer to increment shift register 724 via its "1" output. This cycle continues to propagate a signal in shift register 724. Upon completing propagation through shift register 724, the timer signal emerges as the STROBE signal on line 730, which is transmitted to the clock input of flip-flop 706. Preferably, the time required for the timer signal to propagate through the predetermined number of cycles around timer delay ring 718 and the length of shift register 724 determines the sampling period, or propagation time, for the delay signal.

Preferably, when the STROBE signal reaches flip-flop 706, the signal propagation extent of the delay signal, as reflected by the contents of shift register 714, is transmitted to flip-flop 706. Thereafter, the sampled contents of shift register 714 emerge from flip-flop 706 as thermometer code 736. Thermometer code 736 is preferably indicative of the extent of delay signal propagation within primary delay circuit 702 and the difference between the magnitudes of $V_{sense}$ and $V_{ref}$ for the same reasons discussed in connection with ADC 300 of FIG. 3.

Figure 10:
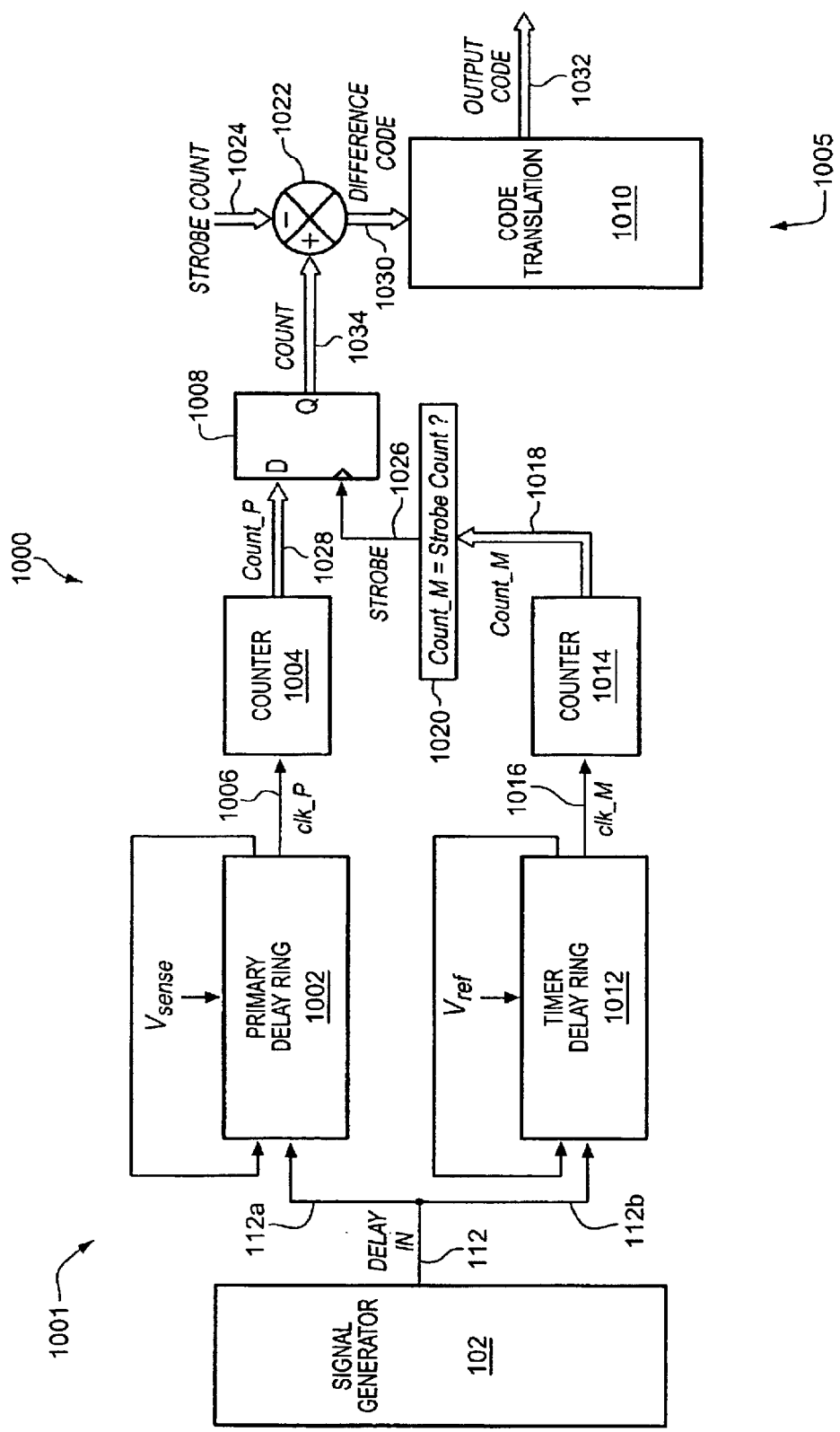
FIG. 10 is a block diagram of a folded version of a matched delay-line ADC with output code conversion according to a preferred embodiment of the present invention.

FIG. 10 is a block diagram of a folded version of a matched delay-line ADC with output code translation according to a preferred embodiment of the present invention. In the delay line ADCs described thus far, either the number of delay cells in a delay block between two consecutive taps of a flat ADC or the total number of delay cells in a delay ring of a folded converter was made to correspond to the desired LSB voltage step-size. This feature is desired since the output codes were determined directly by sampling the taps 308 (in the flat version 300) or the shift register 714 (in the folded version 700) with a strobe signal. In delay line ADC 1000, the number of cells in delay ring 1002 can be smaller than the number of cells required to produce the desired LSB voltage step-size.

FIG. 10 shows a basic folded version of a matched delay line converter with code translation, which we shall refer to as the "folded with CT" design. The output of this design is not a thermometer code, as in the previous embodiments. This design is similar to the folded matched delay line ADC design, in that the delay line is folded into a delay ring, feeding a counter. The defining building block of the matched delay line A/D converter design, the matched delay line, is also present, and is powered by the reference voltage. Since the output of the folded with CT design is not to be a thermometer code, this design does not employ a shift register. Instead, when the binary counter in the timer delay line reaches a certain value, it latches the output of the primary line counter itself. All these blocks together form the main functionality of the folded matched delay line ADC design, providing the self-calibrated reference point, but without any gain calibration. Gain calibration will be discussed below.

ADC 1000 includes signal generator 102, a capture and encoding circuit 1001, and an additional calibration circuit 1005. Capture and encoding circuit 1001 comprises primary delay ring 1002, timer delay ring 1012, counters 1004 and 1014, and flip-flop 1008. Additional calibration circuit 1005 includes difference circuit 1022 and code translation circuit 1010. The output of primary delay ring 1002 is connected to the input of counter 1004 via line 1006. The output of timer delay ring 1012 is connected to the input of counter 1014 via line 1016. The output of counter 1014 is a STROBE signal on line 1026, which is applied to the clock input of flip-flop 1008. The output of counter 1004 is applied to the data input D to flip-flop 1008. The Q output of flip-flop 1034 is applied to difference circuit 1022. A strobe count of counter 1014 is also applied to difference circuit 1022 at 1024. The output of difference circuit 1022 is applied to code translation circuit 1010, which provides an output code at 1032. The structure of primary delay ring 1002 and timer delay ring 1012 is essentially the same as discussed in connection with FIGS. 7–9.

ADC 1000 operates as follows. Assuming that primary delay ring 1002 and matched delay ring 1012, as well as counters 1004 and 1014, are reset, the voltage conversion preferably begins by applying the DELAY IN signal on line 112. As before, primary delay ring 1002 is preferably powered by $V_{sense}$, and timer delay ring 1012 is preferably powered by reference voltage $V_{ref}$. The two rings oscillate and produce clock waveforms clk_P on line 1006 and clk_T on line 1016, respectively. Preferably, a clock waveform frequency output from a delay ring increases with increasing voltage supply to the delay ring. Waveform clk_T drives counter 1014, which may be a binary counter or other type of counter. When counter 1014 output Count_M reaches a fixed value equal to Strobe Count, strobe circuit 1020 asserts the STROBE signal on line 1026. Signal clk_P preferably drives counter 1004, the output of which is Count_P. When the STROBE signal is asserted; signal Count_P is preferably latched in flip-flop 1008.

Preferably, the Strobe Count value, which value is preferably fixed, is digitally subtracted from the Count latched in latch 1008 by difference circuit 1022 to obtain a Difference Code. The value of the Difference Code preferably varies with the voltage difference between $V_{sense}$ and $V_{ref}$. When $V_{sense}=V_{ref}$, the latch Count preferably equals the Strobe Count, and the Difference Code preferably equals zero, regardless of process or temperature variations. This result is essentially the same as that obtained with the ADCs of FIGS. 3 and 7. Where $V_{sense}$ exceeds $V_{ref}$ by more than one-half of the LSB voltage value, the Difference Code is preferably greater than zero. If $V_{ref}$ exceeds $V_{sense}$ by more than one-half of the LSB voltage value, the Difference Code is preferably less than zero. This result is qualitatively similar to the operation of the ADCs of FIGS. 3 and 7, where increasing (or decreasing) the sensed analog voltage by 1 LSB step results in the output code increasing (or decreasing) by 1.

In ADC 1000 of FIG. 10, however, in the preferred embodiment, delay rings 1002 and 1012 are designed such that a 1-LSB step in analog voltage causes the Difference Code to increase or decrease by more than 1 unit. Code translation block 1010 preferably receives the Difference Code on input 1030 and produces the desired Output Code on output 1032. Under nominal process and temperature conditions, a 1-LSB step in $V_{sense}$ 108 generally causes output code 1032 to change by 1. An example of the Code translation function of code translation block 1010 is shown in Table 1 below. The desired function is preferably implemented using digital logic.

TABLE 1

| Difference Code = Dc | Output Code |
| --- | --- |
| Dc <= −7 | −4 |
| −7 < Dc <= −4 | −3 |
| −4 < Dc <= −3 | −2 |
| −3 < Dc <= −1 | −1 |
| −1 < Dc < +1 | 0 |
| +1 <= Dc < +3 | +1 |
| +3 <= Dc < +5 | +2 |
| +5 <= Dc < +7 | +3 |
| +7 <= Dc | +4 |

Code translation block 1010 allows flexibility in choosing the number of delay cells in the delay rings. Moreover, code translation block 1010 preferably allows for correction of nonlinearity in the ADC 1000 characteristic. For example, in the example shown in Table 1 above, the difference codes corresponding to the equally spaced output codes are not all equally spaced.

All of the embodiments of delay lines discussed above have the feature of a self-calibrated point over process and temperature, but the step-size, and thus the effective gain of the A/D converter, also changes with process and temperature. In the worst cases seen in simulation, the smallest step-size was 20 mV and the largest was 60 mV over process and temperature. The folded with CT A/D converter topology provides a way not only to calibrate a reference point in the A/D characteristic, but to calibrate the gain of the A/D characteristic, or, at a minimum, reduce the variations in step-size over process and temperature. This is important because design of the digital controller, whose input is the error code given by the A/D converter, has to take into account the worst case gains of the A/D converter. If the gain of the converter varies less, the controller design can be simplified.

To calibrate the gain, there must be some way to sense the temperature/process corner at which the IC is operating. Temperature and process variations both directly change the speed at which the A/D converter operates, and more specifically, the conversion time of the particular design. This variation in conversion time allows for the self-calibrated reference point, regardless of variations in the temperature or process. If the speed the converter is operating at can be sensed, the particular combination of process and temperature would be known, and its effect could be cancelled out once the matched delay line strobes the primary counter.

Figure 11:
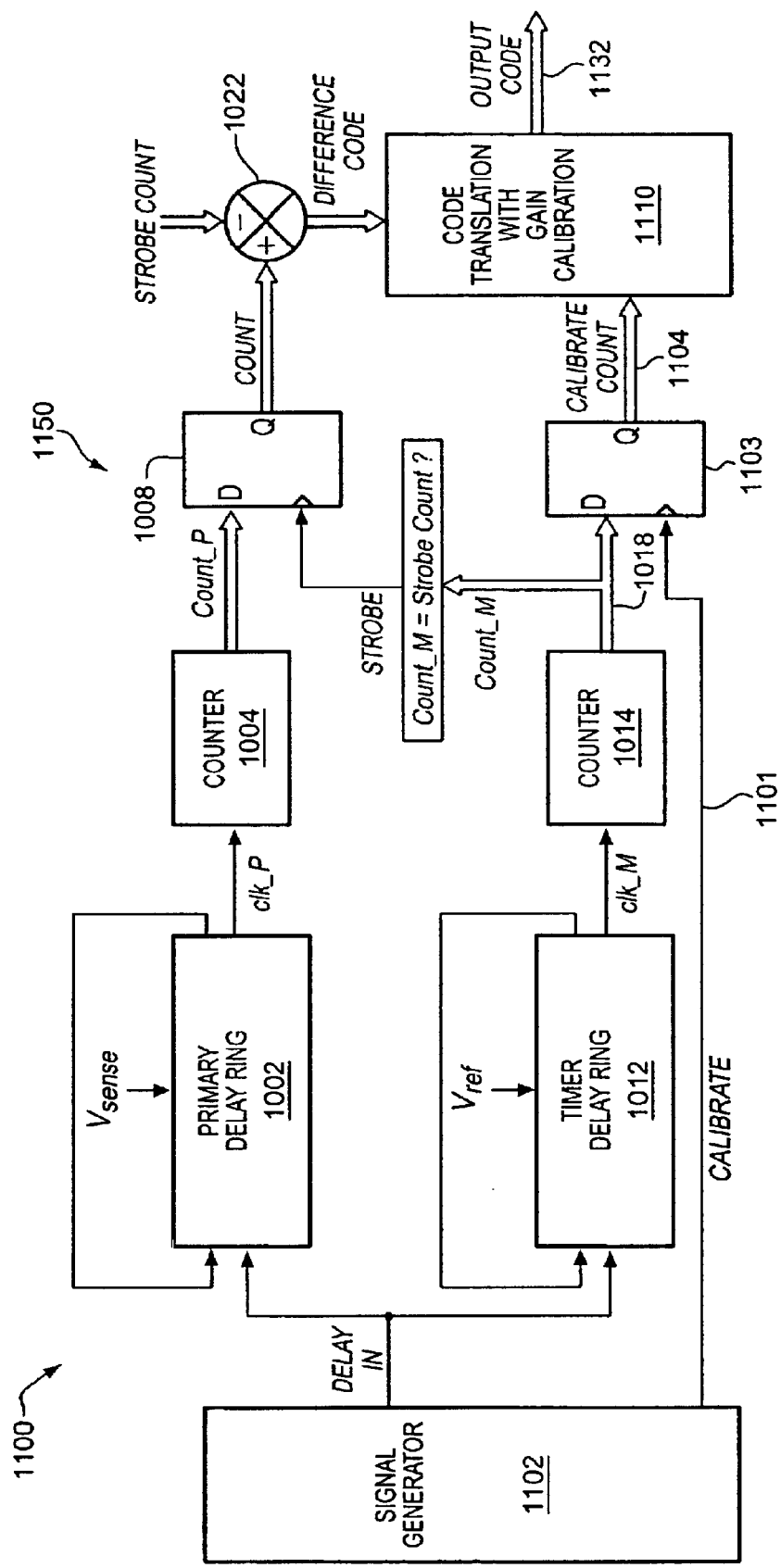
FIG. 11 is a block diagram of a folded version of a matched delay-line ADC with output code conversion and gain calibration according to a preferred embodiment of the present invention.

An ADC 1100 with output code translation and gain calibration is shown in FIG. 11. This is a modification of the converter shown in FIG. 10. The structure of ADC 1100 is the same as the structure of the ADC of FIG. 10, except that it includes an additional flip-flop 1103 and a code translation with gain calibration circuit 1110. In addition, the signal generator 102 provides an additional signal, the CALIBRATE signal which is applied to the clock input of flip-flop 1103. The output 1018 of counter 1014 is applied to the data input D of flip-flop 1103 as well as providing the STROBE output. The Q output of latch 1103 is applied to code translation with gain calibration circuit 1110, along with the output of difference circuit 1022. Code translation with gain calibration circuit 1110 outputs an Output Code on output line 1132, which is adjusted for both the Difference Code and gain calibration.

The CALIBRATE signal is asserted a fixed time after the DELAY IN signal. It latches into latch 1103 the count of timer delay ring 1012 at that time, which we refer to as the Calibrate Count value. The Calibrate Count value is an indication of the process/temperature corner. This value is used in the code translation and gain calibration circuit 1110 to select the code translation function to minimize the gain variation.

Since the supply voltage to the matched line is fixed, any variation in the count value after a fixed time interval is due to process and temperature variations in timer delay ring 1012. If primary delay ring 1002 and timer delay ring 1012 experience the same process and temperature variations, the counter output should be a good gauge of such a variation. In this disclosure, the count latched after a fixed duration of time has elapsed is referred to as the Calibrate Count. If the Calibrate Count is subtracted from the latched value of the primary count, the result is a two's-compliment output error code centered around zero.

Unfortunately, the Calibrate Count cannot be guaranteed to be valid for a given cycle before the timer delay line strobes the primary count. However, the Calibrate Count will almost always not vary from one conversion cycle to the next, since the particular process corner of an IC is fixed, and the temperature is a very slowly changing variable. Thus, the current Calibrate Count is stored for use in the next conversion cycle, and the latched value of primary counter 1004 can be subtracted from the value of the Calibrate Count of the previous cycle. The resulting two's-compliment error code is fed into calibration circuit 1110 along with the Calibrate Count.

Calibration circuit 1110 sets the thresholds for each of the A/D converter output codes based on the value of the Calibrate Count. Once this is accomplished, the error code is compared against these thresholds, and the calibrated output code is obtained.

Figure 12:
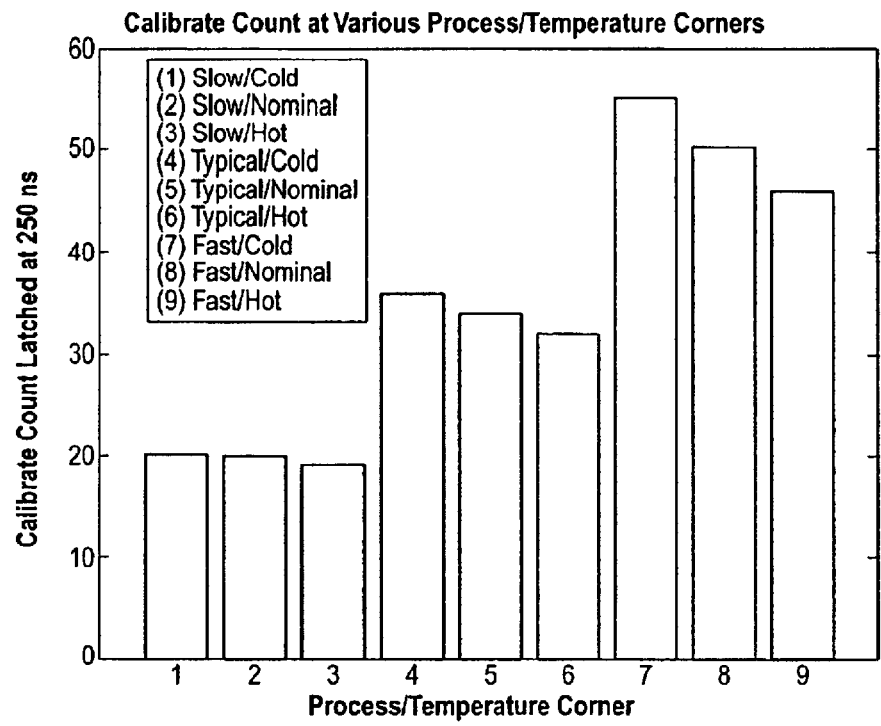
FIG. 12 is a graph of calibrate count data from the ADC of FIG. 11 for nine process/temperature corners.

Once timer delay ring 1012 has been constructed, and the counter verified to operate at the speed at which the delay ring oscillates, the timer delay ring must be characterized. The characterization setup should be such that the timer delay ring is supplied by the reference voltage and is feeding the counter, and it should be under nominal process and temperature conditions. The delay ring should be stimulated and allowed to operate for the desired conversion time, in this case 250 nanoseconds (ns). The output of the counter should be noted; this value is the number that must be programmed to generate the STROBE signal. Next, the process should be repeated over a range of process and temperature variations, and the conversion time, which is the time it takes to reach the counter value recorded above, be recorded for each. This concludes the characterization of the matched delay line. FIG. 12 shows the calibrate count at nine process/temperature corners.

Figure 13:
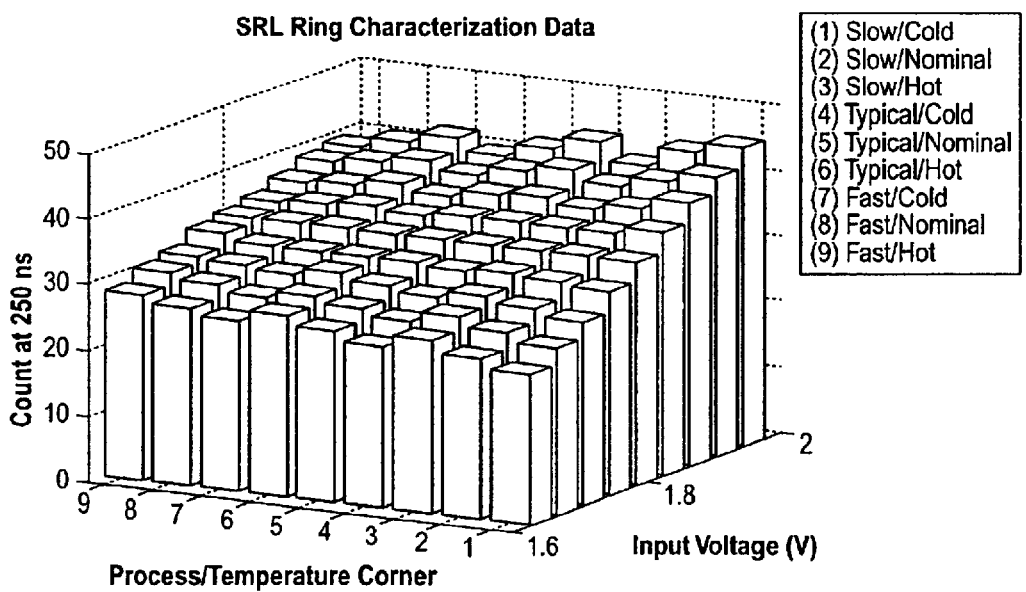
FIG. 13 shows characterization data for the ADC of FIG. 11 for nine process/temperature corners at nine input voltages roughly between 1.6 volts and 2 volts.

The primary delay line characterization is the same basic setup, only now, for every desired process/temperature corner, the voltage should be swept; once the particular process/temperature conversion time has passed, the output of the counter is recorded. At a minimum, datapoints should be taken at each of the threshold voltages, as well as at the process/temperature corners for which the output code should be calibrated. For the IC designed in this disclosure, the folded with CT delay ring was characterized at nine process/temperature corners. FIG. 13 shows a subset of the characterization data, where the Calibrate Counts were taken at voltages corresponding to the center of a voltage step on the A/D characteristic.

The inputs to capture block 1150, i.e., counters 1004 and 1014 and flip-flops 1008 and 1103, are the outputs of primary delay ring 1002 and timer delay ring 1012, the global reset signal, and the CALIBRATE and RESET signals from signal generator 1102. Calibration circuit 1110 simply translates the Difference Code provided as an input by the capture block into the Output code output based on the value of the Calibrate Count. The first step in this process is to set an internal process/temperature code. This code determines what threshold value map will be used. Table 2 shows the remap code with the corresponding threshold values.

TABLE 2

| Output Code | Equivalent Matched Code Value for Different Process/Temperature Codes | | | | | |
|---|---|---|---|---|---|---|
| Threshold | 0 | 1 | 2 | 3 | 4 | 5 |
| −4/−3 | −10 | −9 | −8 | −7 | −6 | −5 |
| −3/−2 | −7 | −7 | −6 | −4 | −4 | −4 |
| −2/−1 | −5 | −4 | −4 | −3 | −3 | −2 |
| −1/0 | −2 | −1 | −1 | −1 | −1 | −1 |
| 0/1 | 1 | 1 | 1 | 1 | 1 | 1 |
| 1/2 | 4 | 3 | 3 | 3 | 2 | 2 |
| 2/3 | 7 | 7 | 6 | 5 | 4 | 3 |
| 3/4 | 10 | 9 | 8 | 7 | 6 | 5 |

Determining which process/temperature code corresponds to which Calibrate Count was done strictly through simulation of nine separate process/temperature corners. The reason there are only six process/temperature codes is because there was significant overlap of the simulated primary counts data at each corner. The calibrated code output is in two's compliment format as opposed to thermometer code output to save on the number of pins used for the prototype chip. If necessary, the system can be altered easily to output an eight-bit thermometer code instead.

Instead of designing the oscillator to closely correspond to the ideal voltage step-size, the folded with CT delay ring is constructed in such a way as to provide the maximum calibration versatility. Calibration circuit 1110 is more accurately able to compensate for variations in the gain because it has more accurate information on exactly what the current process/temperature conditions are. This corresponds directly to the speed of timer delay ring 1012. For example, if the delay through a single delay cell is five nanoseconds, and the timer delay ring is made up of five such cells, under typical conditions the Calibrate Count would reach a count of ten before latched by the CALIBRATE signal. This would mean that, for calibrate circuit 1110 to be able to adjust for variations in the process or temperature, the Calibrate Count would have to change at a minimum to a count of 9 or 11, roughly a 10% change in the propagation time through a single cell. On the other hand, if the delay through a single cell were 1.25 ns, and the delay ring was made up of five cells, the typical Calibrate Count would be 40. In this case, calibration circuit 1110 would be able to adjust the threshold levels after only a 2.5% change in the delay through a single cell. The conclusion is that the faster the individual delay cell can be constructed, and the fewer of them in timer delay ring 1012, calibration circuit 1110 will be less limited. Further, it is evident that properly employing gain calibration preferably involves gathering data on signal propagation speed for various different voltage values at each of a plurality of different temperature/process corners. Such data is preferably gathered prior to commencing the analog-to-digital conversion process.

Once the data is gathered, each temperature/process corner is associated with a schedule of offsets or signal propagation distance adjustments as a function of temperature. Thus, this process involves more than simply subtracting a single "count" from the digital output value of the signal propagation distance in the primary delay line. Rather, a "count" is acquired which preferably represents a currently prevailing temperature/process corner. This count is then used along with the measured signal propagation delay distance in the primary delay line to determine the appropriate offset amount (preferably a digital value). This offset amount is then preferably added or subtracted (as appropriate) from the measured signal propagation delay distance to determine the calibrate count-adjusted, or temperature/process condition-adjusted signal propagation distance.

Figure 14:
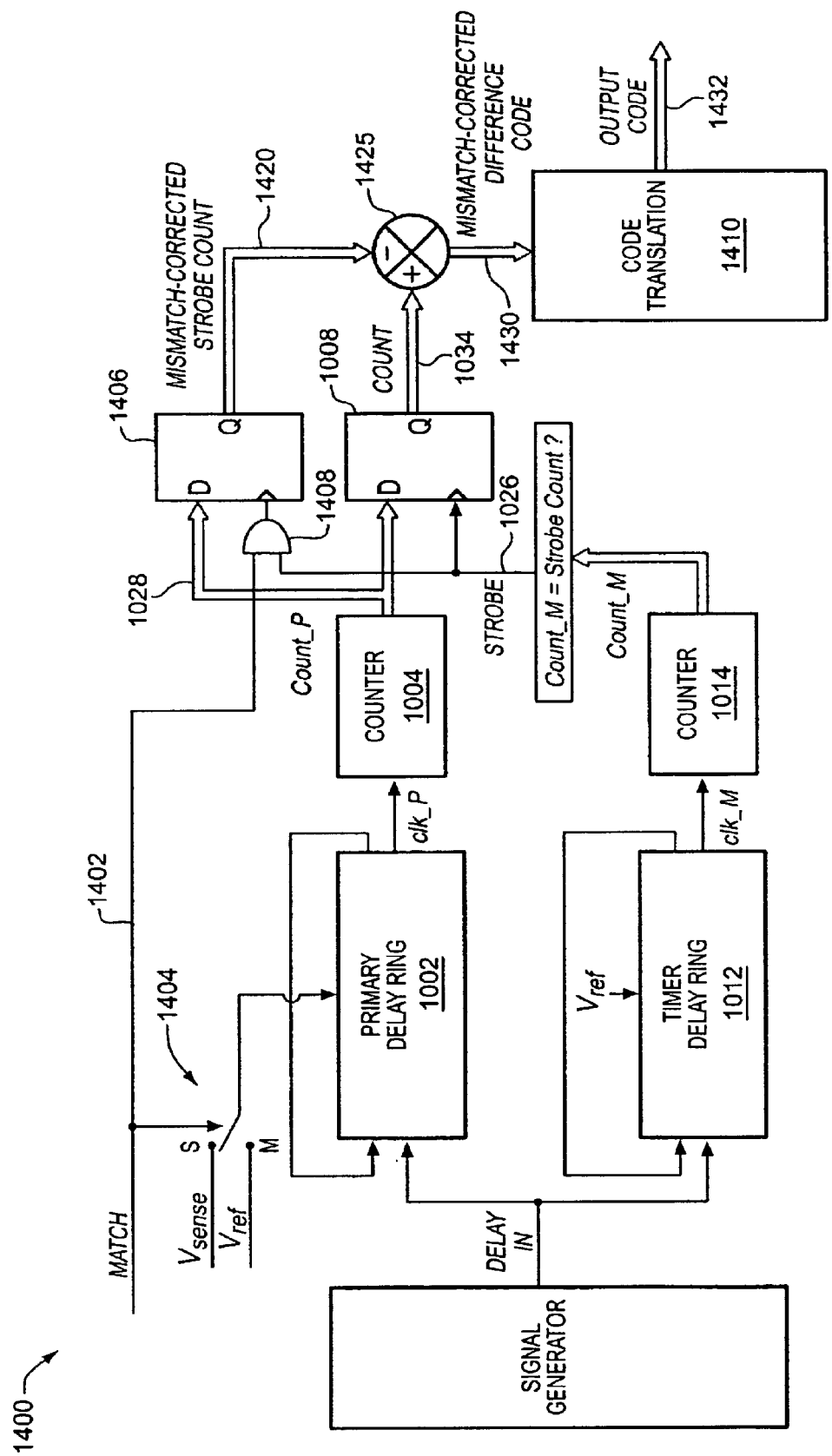
FIG. 14 is a block diagram of a folded version of a matched delay-line ADC with mismatch correction according to a preferred embodiment of the present invention.

Turning now to FIG. 14, a folded matched delay line ADC 1400 with mismatch correction is shown. The structure of ADC 1400 is the same as the structure of the basic folded matched delay line ADC with code translation as shown in FIG. 10, except that it includes a switch 1404 for switching the voltage applied to primary delay ring 1002 between the $V_{sense}$ and $V_{ref}$ voltages, an additional flip-flop 1406, and an AND gate 1408. In addition, another external signal called MATCH is provided on line 1402. Line 1402 applies the MATCH signal to one input of AND gate 1408 and to switch 1404. The output of primary line counter 1004 is applied to the data input D of flip-flop 1406 as well as the same input of flip-flop 1008. The STROBE signal from counter 1014 on line 1026 is applied to the other input of AND gate 1408 as well as the clock input of flip-flop 1008. The output of AND gate 1408 is applied to the clock input of flip-flop 1406. The Q output of flip-flop 1406 is applied to difference circuit 1425 on line 1420. The count on line 1034 is also applied to difference circuit 1425. The mismatch-corrected Difference Code is applied to code translation circuit 1410 via line 1430, and an Output Code including mismatch correction is output on line 1432.

The ADC 1400 of FIG. 14 operates the same as the ADC 1000 of FIG. 10 except when the MATCH signal is high during a match cycle. In a match cycle, primary delay ring 1002 power supply is switched from the sensed voltage to the reference voltage. When timer delay ring 1012 oscillates the designated number of times, the STROBE signal latches the value of counter 1004 on the output of primary ring 1002 into the match_error register 1406. Combinationally, the match_error register count is subtracted from the same hard coded count value that triggers the STROBE signal to determine the two's compliment mismatch between primary delay ring 1002 and timer delay ring 1012. For the prototype chip, the mismatch was truncated to a three-bit number, and was output from the chip for observation, but normally this would not be done. Once the mismatch is computed, the match cycle is complete.

In a normal conversion cycle of ADC 1400, MATCH is low, and switch 1404 operates the sensed voltage to primary delay ring 1002. The outputs of the delay rings feed into their corresponding counters, and the Count_P is latched upon the generation of the STROBE signal. The latched value of primary counter 1004 is subtracted from the mismatch corrected strobe count that was computed in the match cycle. A mismatch-corrected Difference Code is fed to code translation circuit 1410, and the resulting output on line 1432 is corrected for any mismatch between the two delay rings.

Figure 15:
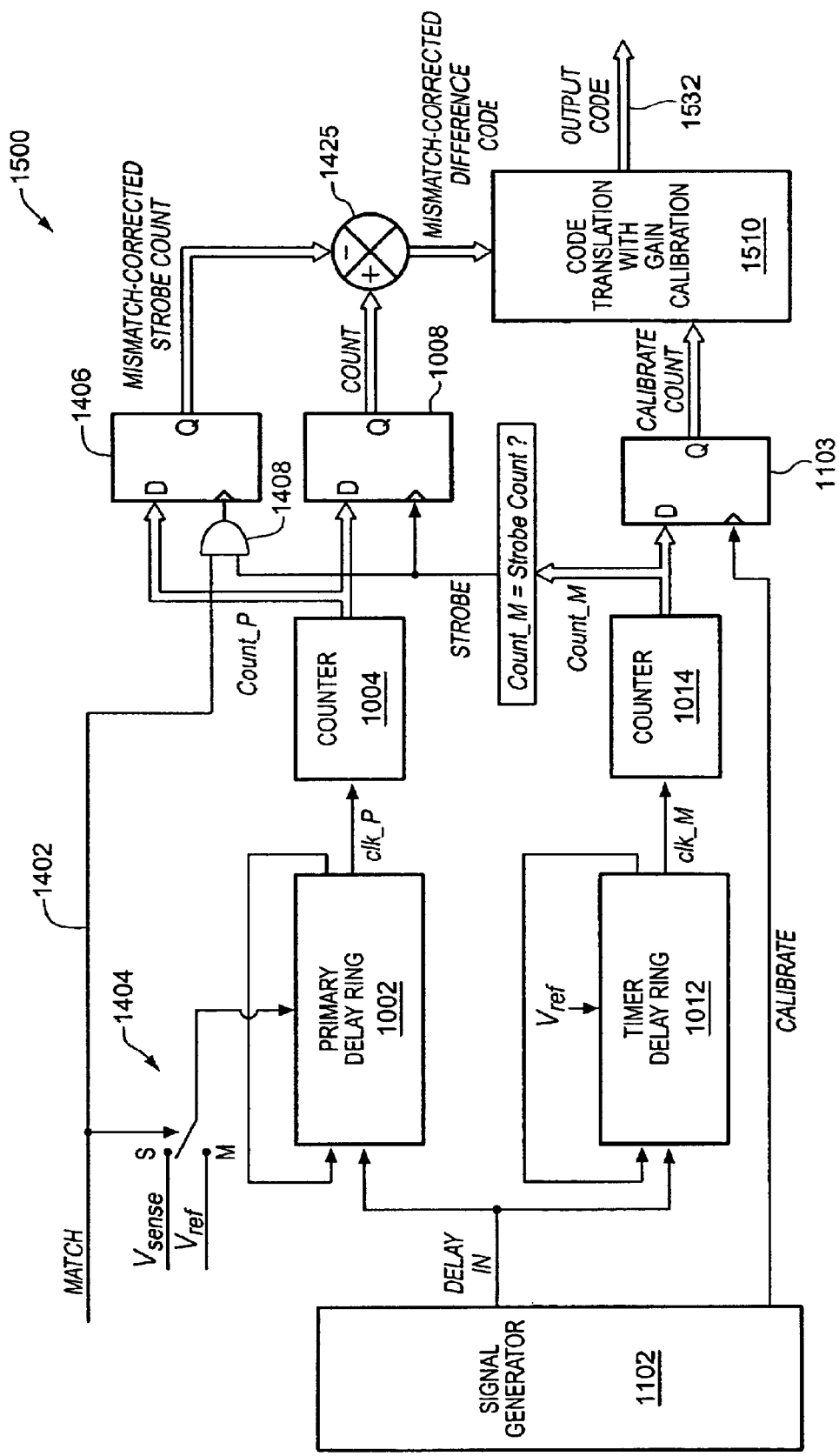
FIG. 15 is a block diagram of a folded version of a matched delay-line ADC with mismatch correction and gain calibration according to a preferred embodiment of the present invention.

FIG. 15 shows a folded matched delay line ADC 1500 with both mismatch correction and gain calibration. ADC 1500 includes both the mismatch correction circuitry of FIG. 14 and the gain calibration circuitry of FIG. 11. ADC 1500 operates in a match cycle just as described above with respect to ADC 1400. In a normal conversion cycle, the reference voltage supplies timer delay line 1012, and the sensed voltage supplies primary delay line 1002. The outputs of the delay rings feed into their corresponding counters 1004 and 1014, the counts of which are latched upon the generation of the STROBE and CALIBRATE signals, respectively. The latched value of timer delay counter 1014 is the Calibrate Count, and is fed to the code translation with gain calibration circuit 1510. The latched value of primary counter 1004 is subtracted from the mismatch-corrected strobe count value that was computed in the match cycle. The resulting output is thus corrected for any mismatch between the two delay rings 1002 and 1012, and is further corrected in calibration circuit 1510 for any gain discrepancies.

Figure 16:
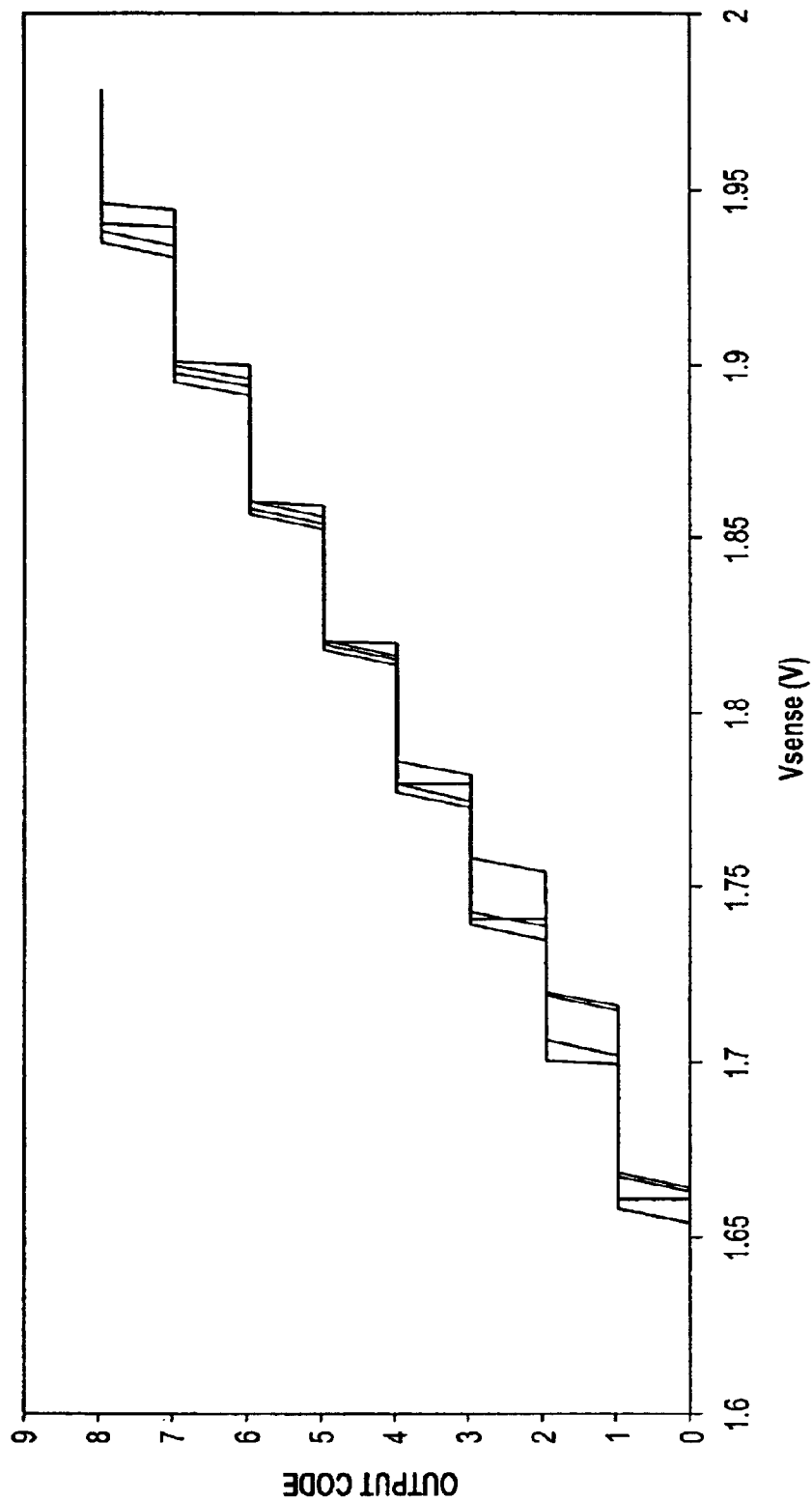
FIG. 16 is a graph of output code versus input voltage, $V_{sense}$, for a simulation of the ADC of FIG. 15 for three worst-case process/temperature combinations.

FIG. 16 shows a simulation of the results for ADC 1500 for three simulation corners: fast process at −40° C., slow process at 125° C., and typical process at the nominal temperature of 27° C. Over these worst-case process/temperature combinations, the folded with CT A/D converter showed a worst-case gain error of 45% of a LSB. This compares to the worst case of the non-folded, non-calibrated converter that showed a variation of roughly ±150% over worst case operating temperatures, neglecting process variations altogether.

There has been described several embodiments of a novel analog-to-digital converter. It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiments described without departing from the inventive concepts. It is also evident that the methods recited may, in many instances, be performed in a different order; or equivalent structures and processes may be substituted for the various structures and processes described. Consequently, the invention is to be construed as embracing each and every novel feature and novel combination of features present in and/or possessed by the invention herein described.

What is claimed is:

1. An analog-to-digital converter (ADC) comprising:
   a source of an input voltage;
   a source of a reference voltage;
   a primary delay line connected to said source of an input voltage, and having a delay signal input and a plurality of tap outputs;
   a timer delay line connected to said source of a reference voltage and having a timer signal input and a timer signal output;
   a delay signal source connected to said delay signal input and said timer delay signal input, and
   a digital output circuit coupled to said tap outputs and said timer signal output to provide a digital output indicative of a difference between said input voltage and said reference voltage.

2. The ADC of claim 1 whereln said ADC is implemented entirely with digital logic gates.

3. The ADC of claim 1 wherein said ADC includes no analog components.

4. The ADC of claim 1 wherein said primary delay line and said timer delay line are incorporated into a single integrated circuit.

5. The ADC of claim 1 wherein said primary delay line comprises a plurality of delay cells.

6. The ADC of claim 5 wherein each of said delay cells comprises a digital logic element.

7. The ADC of claim 1 wherein said timer delay line is substantially one-half the length of said primary delay line.

8. The ADC of claim 1 wherein said delay signal source simultaneously provides a delay signal to said delay signal input and a timer signal to said timer signal input.

9. The ADC of claim 8 wherein said delay signal and said timer signal as provided by said delay signal source are the same signal.

10. The ADC of claim 1 wherein said digital output circuit comprises an array of flip-flop circuits.

11. The ADC of claim 1 wherein said digital output circuit includes a counter.

12. The ADC of claim 1 wherein said digital output circuit includes a shift register.

13. The ADC of claim 1 wherein said primary delay line is a flat delay line.

14. The ADC of claim 1 wherein said primary delay line is a folded delay line.

15. The ADC of claim 1 wherein said primary delay line comprises a number of delay cells corresponding to the desired least significant bit (LSB) voltage step-size.

16. The ADC of claim 1 wherein said primary delay line comprises a number of delay cells smaller than the number of cells required to produce the desired least significant bit (LSB) voltage step-size.

17. The ADC of claim 1 wherein said timer delay line is a flat delay line.

18. The ADC of claim 1 wherein said timer delay line is a folded delay line.

19. The ADC of claim 1 wherein said digital output circuit includes a gain calibration circuit.

20. The ADC of claim 1 wherein said digital output circuit includes a mismatch correction circuit.

* * * * *